United States Patent [19]

Brosadola

[11] Patent Number: 5,205,041
[45] Date of Patent: Apr. 27, 1993

[54] DEVICE FOR REMOVING A PEDUNCLE FROM A PRINTED CIRCUIT BOARD

[75] Inventor: Gianni Brosadola, Opera, Italy
[73] Assignee: Bros Italia S.r.l., Opera, Italy
[21] Appl. No.: 796,656
[22] Filed: Nov. 25, 1991
[30] Foreign Application Priority Data
Nov. 27, 1990 [IT] Italy .................. 22205 A/90
[51] Int. Cl.[5] ............................................. B26B 15/00
[52] U.S. Cl. ........................................ 30/180; 30/182; 30/210
[58] Field of Search .................. 30/180, 182, 228, 210, 30/216; 83/916

[56] References Cited
U.S. PATENT DOCUMENTS

| | | | |
|---|---|---|---|
| 2,650,663 | 9/1953 | Wales et al. | 30/228 |
| 2,714,250 | 8/1955 | Twedt | 30/228 |
| 2,873,523 | 2/1959 | Garland et al. | 30/140 |
| 3,041,725 | 7/1962 | Harries | 30/228 |
| 3,509,706 | 5/1970 | McCutcheon et al. | 30/180 |
| 3,808,683 | 5/1974 | Hetherington | 30/228 |
| 4,312,610 | 1/1982 | Burt | 83/916 |

FOREIGN PATENT DOCUMENTS 1044440  9/1983  U.S.S.R. ................. 30/180

Primary Examiner—Frank T. Yost
Assistant Examiner—Hwei-Siu Payer
Attorney, Agent, or Firm—Jacobson, Price, Holman & Stern

[57] ABSTRACT

A device (10) for removing a connecting peduncle (28) passing through a separation slot (42) between two printed circuit boards (26, 27) includes a reciprocating moving element (13) having a cutting face (14) thereon formed on a undersurface of a projection projecting from a shank (2) slidable between a pair of bucking elements (17, 18) facing each other to provide at least in an initial section thereof a seat in which the shank (2) is insertable without play. The transverse dimension of the moving element (13) is such as to be received in a sliding manner guided in the slot (42) to receive the peduncle between its cutting face (14) and the edges of the bucking elements. The inner end of the shank (2) is connected to a reciprocating part of a motor device (11) so that upon operation of the motor device (11) the moving element (13) cuts the peduncle while the bucking elements (17, 18) engage with their bucking surfaces (15, 16) at the sides of the peduncle to avoid transmission of transverse strains in the printed circuit boards to be separated.

20 Claims, 2 Drawing Sheets

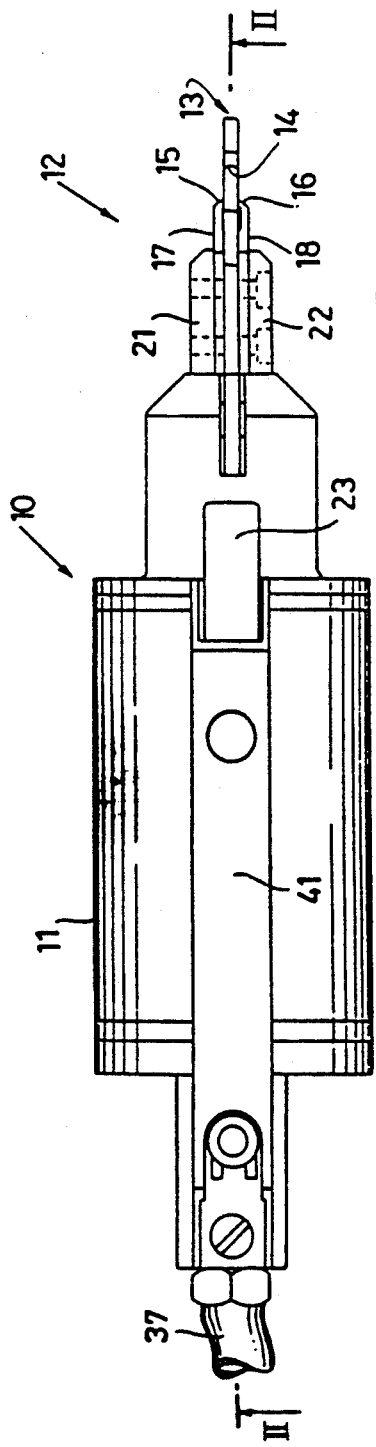
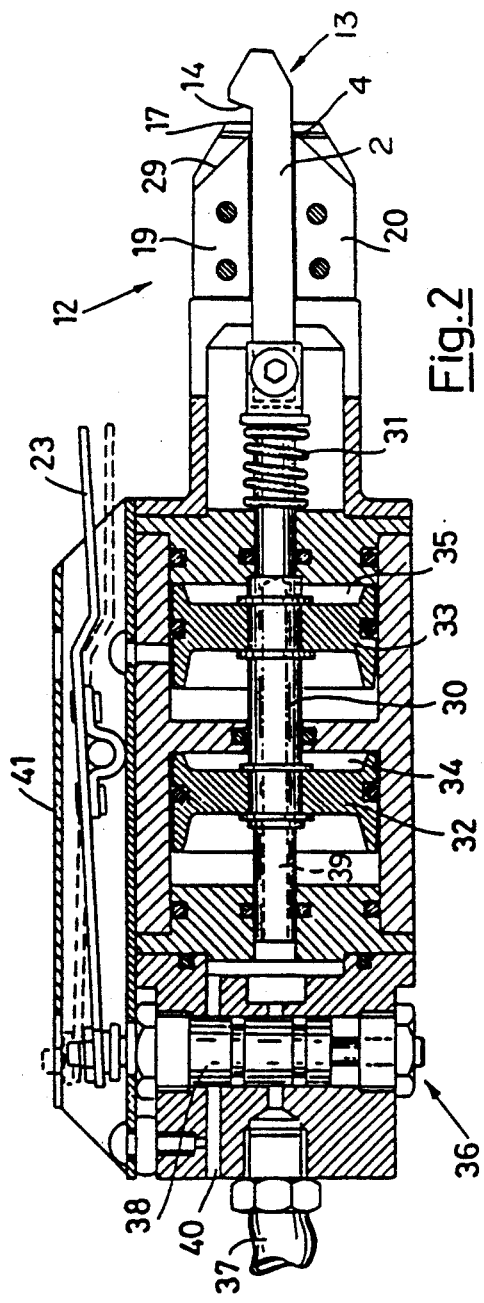
Fig.1
Fig.2

DEVICE FOR REMOVING A PEDUNCLE FROM A PRINTED CIRCUIT BOARD

BACKGROUND OF THE INVENTION

This invention relates to a device for removing peduncles between printed circuit boards.

In the art of mass production of printed circuits there are often provided multiples of the same printed article in a single plate to be later separated from each other after completion of treatment and mounting of the components. Said art is advantageously applied especially with small printed circuits the handling of which whether manual or automatic would be difficult if taken individually, especially in the assembly and welding phase of the components thereof.

Generally, to make easier the subsequent separation of the printed circuits during the production of the board the separation lines between them are milled, thus providing between the printed circuit boards a slot broken only by small joining peduncles which are removed at the end of the assembly operations.

In the known art various solutions to the problem of removing said peduncles have been proposed but they all suffer from various drawbacks which make them unsatisfactory.

For example, there are known numerically controlled machines which eliminate the peduncles by the automatic movement of a small milling head. The need to program the machine on the basis of the conformation of the printed circuit boards to be treated makes the solution acceptable only for large production runs because of the high cost of the machine. In addition the production of dust is high and harmful to the quality of the electronic circuit being processed.

Another separation method calls for the use of shears under which an operator positions sequentially the peduncles of the printed circuit boards to be separated. Shears suffer however from the serious drawback of excessively stressing the printed circuit boards and causing cracking at the edges and possible detachment of the welded components. In addition, the danger of the devices for the operator is high since only a brief distraction is enough to cause a serious injury. Lastly, good skill is required to obtain perfect removal of the peduncles without affecting other parts of the printed circuit board.

As an alternative to the use of expressly made devices there are also used methods which call for the use of general purpose hand cutting tools such as nippers and the like and then hand filing of the ragged edges thus obtained. But it is clear that such systems produce considerable loss of time and results which are not always acceptable. In addition, with very small printed circuit boards the welded components are very near the edge and hence easily damaged during processing.

BRIEF SUMMARY OF THE INVENTION

The general object of the present invention is to obviate the above mentioned drawbacks by providing a tool for removal of peduncles between printed circuit boards which is economical, easy and safe to use, and gives perfect trimming of the edges separated by it without stressing the printed circuit board and the components on it.

The present invention achieves the above objects by providing a device for removal of a joining peduncle passing through a slot separating two printed circuit boards characterized by a moving element having reciprocal motion to bring a cutting face thereof, formed on the underside of a projection projecting from a shank between a pair of bucking elements facing each other to provide at least in an initial section thereof a seat in which the shank can be inserted without play, the transverse size of the moving element being such that it is received in a sliding manner and guided in the slot to receive the peduncle between the cutting face and the edges of the bucking elements.

BRIEF DESCRIPTION OF THE DRAWINGS

To further clarify the explanation of the innovative principles of the present invention and its advantages as compared with the known art there is described below an embodiment as an example applying to the principles of the invention with reference to the accompanying drawings wherein:

FIG. 1 is a side elevation view of a separating device in accordance with the present invention;

FIG. 2 is a partial cross-sectional view taken along line II—II of FIG. 1;

DETAILED DESCRIPTION

With reference to the drawings a removing device, indicated generally by reference numbers 10 in FIG. 1, in accordance with the present invention comprises a motor body 11 for operation of a cutting head 12.

As can be seen better in FIG. 2 the cutting head 12 is made up of an element 13 which slides inwardly of the cutting head upon operation of the motor means contained in the body 11.

Figure 3:
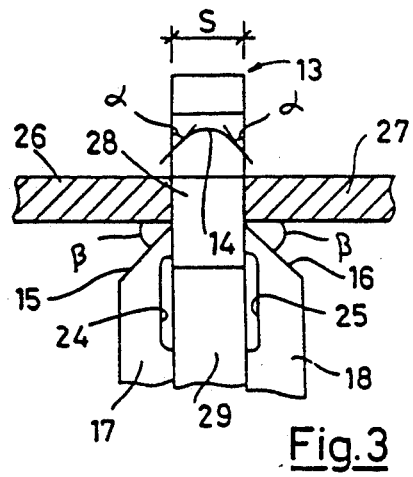
FIGS. 3, 4 and 5 are enlarged cross-sectional views of an operative sequence of the device of FIG. 1.

The sliding element 13 has a generally L-shaped form with a shank 2 and a cutting face 14 facing bucking surfaces 15 and 16 belonging to two laminations or bucking elements 17 and 18 arranged at the two sides of the element 13. Between the two laminations are also included plates 19 and 20 to define with elements 17, 18 a seat 4 for sliding passage of shank 2 of element 13. Laminations 17, 18 and plates 19, 20 are packed and fixed between spurs 21 and 22 projecting from the body 11. As can be seen clearly in FIG. 3 the cutting face 14 extends longitudinally with a concave surface with side cutting edges inclined inward at an angle $\alpha$. The bucking surfaces 15, 16 are inclined opposite to each other at an angle $\beta$. In addition the laminations 17 and 18 are relieved internally at 24 and 25 respectively.

Figure 4:
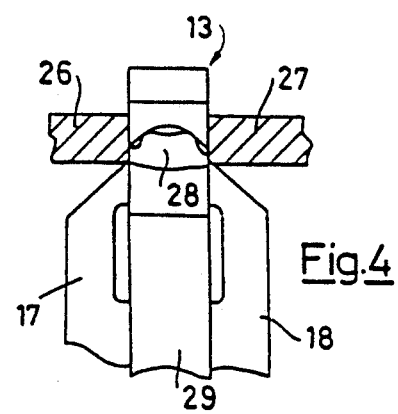

In using the device the element 13 is fitted in the slot existing between two printed circuit boards, indicated in FIG. 4 generally by 26 and 27. The thickness "s" of the moving part 13 is provided to be only a few hundredths of a millimeter less than the slot so that the element 13 can slide freely, guided accurately by the slot until it reaches a first peduncle 28 which unites printed circuit boards and which, in this manner, abuts under the surface 14 as may be seen clearly in FIG. 6.

When the motor means contained in the body 11 is operated the element 13 retracts, sinking the side edges into the peduncle flush with the walls of the slot between the printed circuit boards. At the same time the bucking surfaces 17 and 18 engage below with the sides of the peduncle preventing the two printed circuit boards 26 and 27 from the drawing apart under the effect of the cutting element 13. The sharp edge of the bucking surfaces must cut into the surface of the peduncle to hold the printed circuit boards in position without the bucking members sinking excessively. The inclination of the bucking surfaces 15 and 16 also prevents the printed circuit boards from bending upward under the effect of the sinking of the cutting face 14.

For this purpose the angle $\beta$ has been found to be advantageously between 4° and 30° and preferably about 15°. During continuance of the cutting action (FIG. 4) the peduncle is compressed by the concave form of the surface 14 so as to detach itself from the cutting edges without stressing the printed circuit boards at the sides. To obtain a good cut it has been found that the angle $\alpha$ can advantageously be between 20° and 50°. Preferably this angle can be about 30°.

Figure 5:
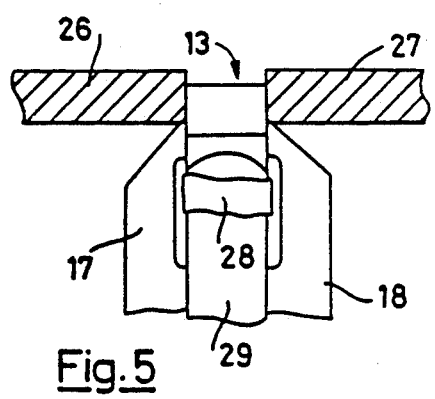
Figure 6:
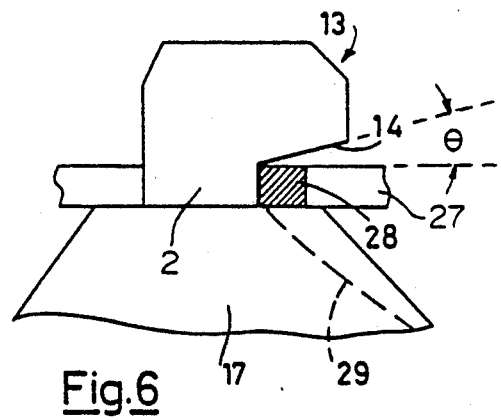
FIG. 6 is a left side view of FIG. 3.

As shown in FIG. 6, to facilitate the sinking of the cutting edges of the face 14 in the peduncle the edges are inclined at an angle $\theta$ relative to the cutting face a plane extending transversely to the longitudinal axis of the shank 2, or the direction of reciprocation of the element 13. This angle has been found between 5° and 20° and preferably about 10°. When the peduncle is completely cut the further travel of the element 13 pushes it (FIG. 5) into the widened zone of the bucking elements so that it is released and is removed due to the chute conformation of the surface 29 on plates 19,20 between the bucking members.

The peduncle is thus completely eliminated and the resulting edges of the slot between the printed circuit boards are perfectly finished.

The element 13 then returns to the initial position and the tool can be guided along the slot between the printed circuit boards until it meets the next peduncle to be removed.

As may be seen, with a cutting head in accordance with the present invention the peduncles are removed rapidly and accurately without producing dust or transmitting excessive stresses to the printed circuit boards and the components thereof.

FIG. 2 shows a possible embodiment of the power unit 11. The shank of the element 13 is connected to a rod 30 of a compressed actuator unit to be moved against the action of a spring 31. To obtain a favorable ratio of space occupied to power the compressed actuator unit is provided by means of two coaxial pistons 32, 33 supported on the rod 30 to slide in separate chambers 34, 35 respectively. The rod 30 is drilled axially at 39 to supply compressed air to the two chambers 34, 35 for operating a valve 36. In particular, compressed air arriving from a duct 37 is supplied to the valve 36. A slide valve 38 when driven by a lever 23 toward the position shown in dash lines places the duct 37 in communication with the duct 39 which supplies compressed air to the pistons so as to control the element 13 in its cutting travel. Next the slide valve 38 puts the duct 39 in communication with an exhaust duct 40 so that the spring 31 can retract the pistons 32 and 33 and return the element 13 to its rest position.

Figure 7:
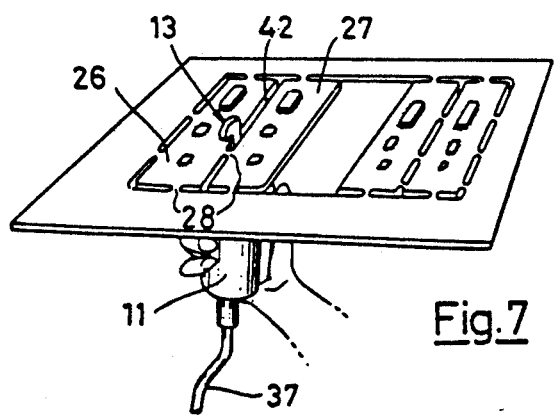
FIG. 7 is a perspective view of the device of FIG. 1 showing its use.

Advantageously the lever 23 is partially protected by a shell 41 to prevent accidental operation thereof. The embodiment just described is usable as a hand tool by forming the case 11 in a graspable manner so that the tool can be used as shown in FIG. 7.

The invention provides a very manageable, fast and accurate tool, the cutting head being guided by the slots 42 between the printed circuit boards. In addition, safety is very high because the space between the cutting face 14 and the strikers 15, 16 is very limited and hence at the worst can only pinch the operator's skin in case of improper use or accidental contact.

Naturally the above description of an embodiment applying the innovative principles of the present invention is given merely by way of example and therefore is not to be taken as a limitation of the patent right claimed here. For example, it can be readily imagined how the peduncle removing unit described can be used as a device fixed to a bench while the printed circuit board is moved manually. In addition the motor means can be different than shown. For example, if the dimensions of the motor body do not constitute a problem the two pistons can be replaced by a single larger piston. It could also be imagined to use motor means operating differently such as, for example, electrical motor means consisting of an electric motor with reducing gears.

I claim:

1. The device for removing a joining peduncle passing through a slot between and separating two printed circuit boards at sides thereof comprising:

a body having an outer end portion;

a pair of bucking elements on said outer end portion of said body in mutually spaced relationship relative to each other to provide a seat therebetween and having outer edges;

a cutting member having a shank portion slidably mounted in close-fitting relationship in said seat for reciprocal movement therein between said bucking elements;

a projection portion projecting laterally on said shank portion and having an underside facing substantially inwardly toward said body; and a cutting face extending longitudinally on said underside and having a concave surface defining sharp lateral cutting edges;

said cutting member having a transverse width of a predetermined size relative to the width of said slot between said printed circuit boards for insertion of said cutting member in slidable close-fitting guided relationship in said slot with said peduncle between said cutting face and said outer edges of said bucking elements in a cutting position, so that reciprocation of said cutting member inwardly toward said body in said cutting position cuts said peduncle substantially at the sides of said printed circuit boards.

2. The device as claimed in claim 1 and further comprising:

a guide body portion on said outer end portion of said body; and said bucking elements being mounted on said guide body portion.

3. The device as claimed in claim 2 wherein:

said projection portion has parallel outer side faces; and said concave surface of said cutting face adjoins said outer parallel side faces at an angle in the range between 20° and 50°.

4. The device as claimed in claim 3 wherein:

said lateral cutting edges are inclined outwardly relative to a plane extending traversely to the direction of reciprocation of said cutting member at an angle between 5° and 20°.

5. The device as claimed in claim 1 wherein:

said lateral cutting edges are inclined outwardly relative to a plane extending transversely to the direction of reciprocation of said cutting member at an angle between 5° and 20°.

6. The device as claimed in claim 1 and further comprising:

motor means in said body for reciprocating movement in a direction substantially parallel to the direction of reciprocation of said cutting member;

resilient means in said body resiliently urging said motor means outwardly toward said bucking elements;

means connectable with said body for urging said motor means in an inward direction against the force of said resilient means; and means for connecting said shank portion of said cutting member to said motor means, so that operation of said motor means reciprocates said cutting member inwardly toward said bucking elements.

7. The device as claimed in claim 6 wherein:
said resilient means comprises a spring means.

8. The device as claimed in claim 6, wherein:
said motor means comprises a casing having a size and configuration for grasping by the hand of an operator.

9. The device as claimed in claim 8 and further comprising:

manual control means mounted on said casing and operatively connected to said motor means for operating said motor means for moving said cutting member in the cutting direction.

10. The device as claimed in claim 8, wherein:
said motor means comprises compressed air operated actuators in said casing.

11. The device as claimed in claim 10 wherein said compressed air actuators comprise:

two co-axial cylinder and piston means in said casing;

a common shaft interconnecting pistons of said cylinder and piston means for simultaneous movement and connected to said shank of said cutter member.

12. The device as claimed in claim 11 and further comprising an air duct co-axially extending in said common shaft;

means for communicating said air duct with cylinders of said cylinder and piston means; and means for connecting said air duct to a compressed air source for operation of said motor means in the cutting direction.

13. The device as claimed in claim 12 and further comprising:

valve means in said casing for supplying compressed air from said compressed air source to said compressed air actuators for operating said motor means to move said cutting member in the cutting direction; and a manual control operating lever mounted on said casing and engaging said valve means so that operation of said lever manually in one direction operates said valve means to supply compressed air to said compressed air actuators.

14. The device for removing a joining peduncle passing through a slot between and separating two printed circuit boards at sides thereof comprising:

a body having an outer end portion;

a pair of bucking elements on said outer end portion of said body in mutually spaced relationship relative to each other to provide a seat therebetween and having outer edges;

a cutting member having a shank portion slideably mounted in close-fitting relationship in said seat for reciprocal movement therein between said bucking elements;

a projection portion projecting laterally on said shank portion and having an underside facing substantially inwardly toward said body;

a cutting face extending longitudinally on said underside of said projection portion;

outer supporting faces on said bucking elements inclined inwardly toward said cutting face and forming a sharp edge on each bucking element adjacent said seat, said sharp edges being engagable with said peduncle during a cutting operation; and said cutting member having a transverse width of a predetermined size relative to the width of said slot between said printed circuit boards for insertion of said cutting member in slidable close-fitting guided relationship in said slot with said peduncle between said cutting face and said sharp edges on said bucking elements in a cutting position, so that reciprocation of said cutting member inwardly toward said body in said cutting position cuts said peduncle substantially at the sides of said printed circuit boards.

15. The device as claimed in claim 14 wherein:
said inclined outer supporting faces on said bucking elements comprise planer surfaces extending at an angle relative to a plane transverse to a direction of reciprocation of said cutting member between 4° and 30°.

16. The device as claimed in claim 14 wherein:
said projection portion has parallel outer side faces; and a concave surface is provided on said cutting face adjoining said parallel outer side faces at an angle in the range between 20° and 50°.

17. The device as claimed in claim 14 wherein:
lateral cutting edges are provided on said cutting face inclined outwardly relative to a plane extending traversely to a direction of reciprocation of said cutting member at an angle between 5° and 20°.

18. The device as claimed in claim 14 and further comprising:

motor means in said body for reciprocating movement in a direction substantially parallel to the direction of reciprocation of said cutting member;

resilient means in said body for resiliently urging said motor means outwardly toward said bucking elements;

means connectable with said body for urging said motor means in an inward direction against the force of said resilient means; and means for connecting said shank portion of said cutting member to said motor means, so that operation of said motor means reciprocates said cutting member inwardly toward said bucking elements.

19. The device for removing a joining peduncle passing through a slot between and separating two printed circuit boards at sides thereof comprising:

a body having an outer end portion;

a pair of bucking elements on said outer end portion of said body in mutually spaced relationship relative to each other to provide a seat therebetween and having outer edges;

a cutting member having a shank portion slideably mounted in close-fitting relationship in said seat for reciprocal movement therein between said bucking elements;

a projection portion projecting laterally on said shank portion and having an underside facing substantially inwardly toward said body;

a cutting face extending longitudinally on said underside of said projection portion;

said cutting member having a transverse width of a predetermined size relative to the width of said slot between said printed circuit boards for insertion of said cutting member in slidable close-fitting guided relationship in said slot with said peduncle between said cutting face and said outer edges of said bucking elements in a cutting position, so that reciprocation of said cutting member inwardly toward said body in said cutting position cuts said peduncle substantially at the sides of said printed circuit boards; and openings in said seat between said bucking elements and said shank portion for providing an initial discharge path for a removed peduncle.

20. The device as claimed in claim 19 wherein:

lateral cutting edges are provided on said cutting face inclined outwardly relative to a plane extending traversely to a direction of reciprocation of said cutting member at an angle between 5° and 20°.

* * * * *